(12) United States Patent
Sangamkar et al.

(10) Patent No.: US 10,817,393 B2
(45) Date of Patent: *Oct. 27, 2020

(54) MANAGER ELECTION FOR ERASURE CODING GROUPS

(71) Applicant: NetApp, Inc., Sunnyvale, CA (US)

(72) Inventors: Dheeraj Raghavender Sangamkar, Vancouver (CA); Song Guen Yoon, Coquitlam (CA); Emalayan Vairavanathan, Vancouver (CA); Yi Zhang, Vancouver (CA)

(73) Assignee: NETAPP, INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/391,842

(22) Filed: Apr. 23, 2019

(65) Prior Publication Data

US 2019/0251009 A1 Aug. 15, 2019

Related U.S. Application Data

(63) Continuation of application No. 15/589,872, filed on May 8, 2017, now Pat. No. 10,503,621, which is a
(Continued)

(51) Int. Cl.
*G06F 11/20* (2006.01)
*G06F 11/10* (2006.01)
(Continued)

(52) U.S. Cl.
CPC .......... *G06F 11/2092* (2013.01); *G06F 3/064* (2013.01); *G06F 3/067* (2013.01);
(Continued)

(58) Field of Classification Search
CPC .... G06F 11/2092; G06F 3/0619; G06F 3/064; G06F 3/067; G06F 11/1076; G06F 2201/805; G06F 3/1234; G06F 9/5038; G06F 11/1402; G06F 11/1471; G06F 11/1489; G06F 11/2069; G06F 11/20;
(Continued)

(56) References Cited

U.S. PATENT DOCUMENTS 8,315,999 B2 * 11/2012 Chatley ................ G06F 3/0613
707/705
9,092,441 B1 * 7/2015 Patiejunas ............ G06F 16/185
(Continued)

*Primary Examiner* — John J Tabone, Jr.
(74) *Attorney, Agent, or Firm* — Haynes and Boone, LLP

(57) ABSTRACT

To ensure that there is an elected manager among storage nodes of an erasure coding group ("ECG"), an ECG manager ("ECGM") election process is periodically performed among available storage nodes that are configured with the software to perform the services of an ECGM. When a storage node is activated, an ECGM process of the storage node begins executing and is assigned a process identifier ("PID"). A storage node can utilize a service query framework to identify other available storage nodes and retrieve their ECGM PIDs. The storage node then selects a PID according to a criterion and elects the storage node corresponding to the selected PID to be the acting ECGM. This process is performed periodically, so even if the acting ECGM storage node fails, a new ECGM is eventually selected from the available storage nodes.

20 Claims, 15 Drawing Sheets

Related U.S. Application Data continuation-in-part of application No. 14/696,001, filed on Apr. 24, 2015, now Pat. No. 9,921,910.

(51) Int. Cl.

| | |
|---|---|
| *H04L 29/08* | (2006.01) |
| *G06F 3/06* | (2006.01) |
| *G06F 11/14* | (2006.01) |
| *G06F 3/12* | (2006.01) |
| *H04L 29/14* | (2006.01) |
| *H03M 13/15* | (2006.01) |
| *G06F 9/50* | (2006.01) |

(52) U.S. Cl.
CPC ......... *G06F 3/0619* (2013.01); *G06F 3/1234* (2013.01); *G06F 9/5038* (2013.01); *G06F 11/1076* (2013.01); *G06F 11/1402* (2013.01); *G06F 11/1471* (2013.01); *G06F 11/1489* (2013.01); *G06F 11/2069* (2013.01); *H03M 13/154* (2013.01); *H04L 67/1097* (2013.01); *H04L 69/40* (2013.01); *G06F 11/20* (2013.01); *G06F 2201/805* (2013.01); *G06F 2201/85* (2013.01); *G06F 2211/1028* (2013.01)

(58) Field of Classification Search
CPC ........ G06F 2201/85; G06F 2211/1028; H03M 13/154; H04L 67/1097; H04L 69/40
USPC ................. 714/764, 770, 773, 6.2; 711/114; 709/223
See application file for complete search history.

(56) References Cited

U.S. PATENT DOCUMENTS

| | | | | |
|---|---|---|---|---|
| 9,213,709 | B2 * | 12/2015 | Patiejunas | G06F 16/113 |
| 9,354,683 | B2 * | 5/2016 | Patiejunas | G06F 1/266 |
| 9,594,632 | B2 * | 3/2017 | Luby | G06F 11/1076 |
| 9,767,129 | B2 * | 9/2017 | Patiejunas | G06F 16/2228 |
| 9,779,035 | B1 * | 10/2017 | Patiejunas | G06F 13/00 |
| 9,817,715 | B2 * | 11/2017 | Slik | G06F 11/1076 |
| 9,830,111 | B1 * | 11/2017 | Patiejunas | G06F 3/0625 |
| 9,880,753 | B2 * | 1/2018 | Sawicki | G06F 3/0607 |
| 9,921,910 | B2 * | 3/2018 | Sangamkar | G06F 11/1489 |
| 10,503,621 | B2 * | 12/2019 | Sangamkar | G06F 3/0619 |
| 2007/0214314 | A1 * | 9/2007 | Reuter | G06F 3/0607 711/114 |
| 2009/0132543 | A1 * | 5/2009 | Chatley | G06F 3/0647 |
| 2009/0210452 | A1 * | 8/2009 | Ishii | G06F 3/0607 |
| 2012/0310892 | A1 * | 12/2012 | Dam | G06F 11/2094 707/659 |
| 2013/0145105 | A1 * | 6/2013 | Sawicki | G06F 3/0619 711/147 |
| 2013/0151653 | A1 * | 6/2013 | Sawicki | G06F 15/17331 709/216 |
| 2013/0275815 | A1 * | 10/2013 | De Keyser | G06F 11/30 714/47.2 |
| 2014/0164694 | A1 * | 6/2014 | Storer | G06F 11/1092 711/114 |
| 2015/0163206 | A1 * | 6/2015 | McCarthy | G06F 21/6227 713/171 |
| 2016/0011936 | A1 * | 1/2016 | Luby | G06F 3/0617 714/6.2 |
| 2016/0011939 | A1 * | 1/2016 | Luby | G06F 11/1076 714/764 |
| 2016/0246512 | A1 * | 8/2016 | Li | G06F 3/0604 |
| 2016/0314043 | A1 * | 10/2016 | Slik | G06F 11/1076 |
| 2017/0228409 | A1 * | 8/2017 | Darcy | G06F 16/1815 |
| 2017/0228412 | A1 * | 8/2017 | Agarwal | H04L 9/3268 |
| 2017/0242732 | A1 * | 8/2017 | Vairavanathan | G06F 9/5038 |
| 2017/0242770 | A1 * | 8/2017 | Sangamkar | G06F 3/0619 |
| 2017/0286445 | A1 * | 10/2017 | Gowdappa | G06F 16/1774 |
| 2018/0095855 | A1 * | 4/2018 | Sanakkayala | G06F 11/3495 |
| 2018/0150536 | A1 * | 5/2018 | Lai | G06F 16/2246 |
| 2018/0165155 | A1 * | 6/2018 | Sangamkar | G06F 3/1234 |
| 2019/0251009 | A1 * | 8/2019 | Sangamkar | G06F 11/2092 |

* cited by examiner

Virtual Chunk Space Terminology

- ChunkService == Storage Node
  - One per Storage Node
  - Stores chunks/fragments

- Virtual Chunk Spaces (VCS)
  - ChunkService is split into multiple VCSs
  - Resides only in a single storage volume (RangeDB)
  - Unit of failure

- EC Group
  - Set of VCSs form a Storage Pool as defined by an EC Profile
  - An EC Group stores all stripes of a given object

*FIG. 2B*

| Chunk Service | SN 1 | SN 2 | SN 3 | SN 4 | SN 5 | SN 6 |
|---|---|---|---|---|---|---|
| EC Group 1 | D | | D | | P | |
| EC Group 2 | D | | D | | | P |
| ... | | | | | | |
| EC Group n-1 | P | | | D | | D |
| EC Group n | | P | | D | | D |
| Site | A | A | B | B | C | C |

*FIG. 7*

MANAGER ELECTION FOR ERASURE CODING GROUPS

PRIORITY CLAIM

This application is a continuation of U.S. patent application Ser. No. 15/589,872, filed on May 8, 2017, which claims priority to U.S. patent application Ser. No. 14/696,001, filed on Apr. 24, 2015 now U.S. Pat. No. 9,921,910 issued on Mar. 20, 2018, both of which are incorporated herein by reference in their entirety.

BACKGROUND

Several of the disclosed embodiments relate to distributed data storage services, and more particularly, to storing data in a distributed data storage system using virtual chunk services.

In distributed data storage systems, various methods can be used to store data in a distributed manner, e.g., to improve data reliability, protection. Erasure coding is one such method of data protection in which a data object is broken into fragments, encoded with parity information and stored across a set of different storage nodes in the distributed data storage system. When a data object is erasure coded, the distributed data storage system has to typically store the storage information in its metadata. This metadata can include identities of the storage nodes that store each fragment of the encoded data object. When a storage node in the distributed data storage system fails, all the objects that were stored in that storage node have to be discovered and repaired, so that the reliability is not compromised.

For recovering the lost data, the distributed data storage system may have to go through the metadata of all the data objects to identify the data objects impacted by the failed node. Then alternate nodes are selected to move the fragments. After the fragments are moved, the metadata of each moved object should be updated to reflect the new set of storage nodes that the fragments of the objects are stored in. This approach can be resource intensive and can have the following performance bottlenecks: (a) metadata query for each object to find if it is impacted and (b) metadata update for each impacted object after repair due to node or volume loss. This can be a resource intensive process as the distributed data storage system can have a significantly large number of data objects, e.g., billions of data objects. Further, reading such significantly large number of data objects to identify a subset of them that are stored on the failed node, which can be a small the fraction of entire number of data objects is inefficient. In a system with billions of data objects, with each node storing millions of fragments, both these can cause serious performance issues for the recovery process.

BRIEF DESCRIPTION OF THE DRAWINGS

Aspects of the disclosure may be better understood by referencing the accompanying drawings.

FIG. 2B is an example describing various layers of the VCS layout.

FIG. 7 is a table of storage nodes and erasure coding groups showing data fragments of different objects stored at different storage nodes, consistent with various embodiments.

DESCRIPTION

Introduction

Figure 1:
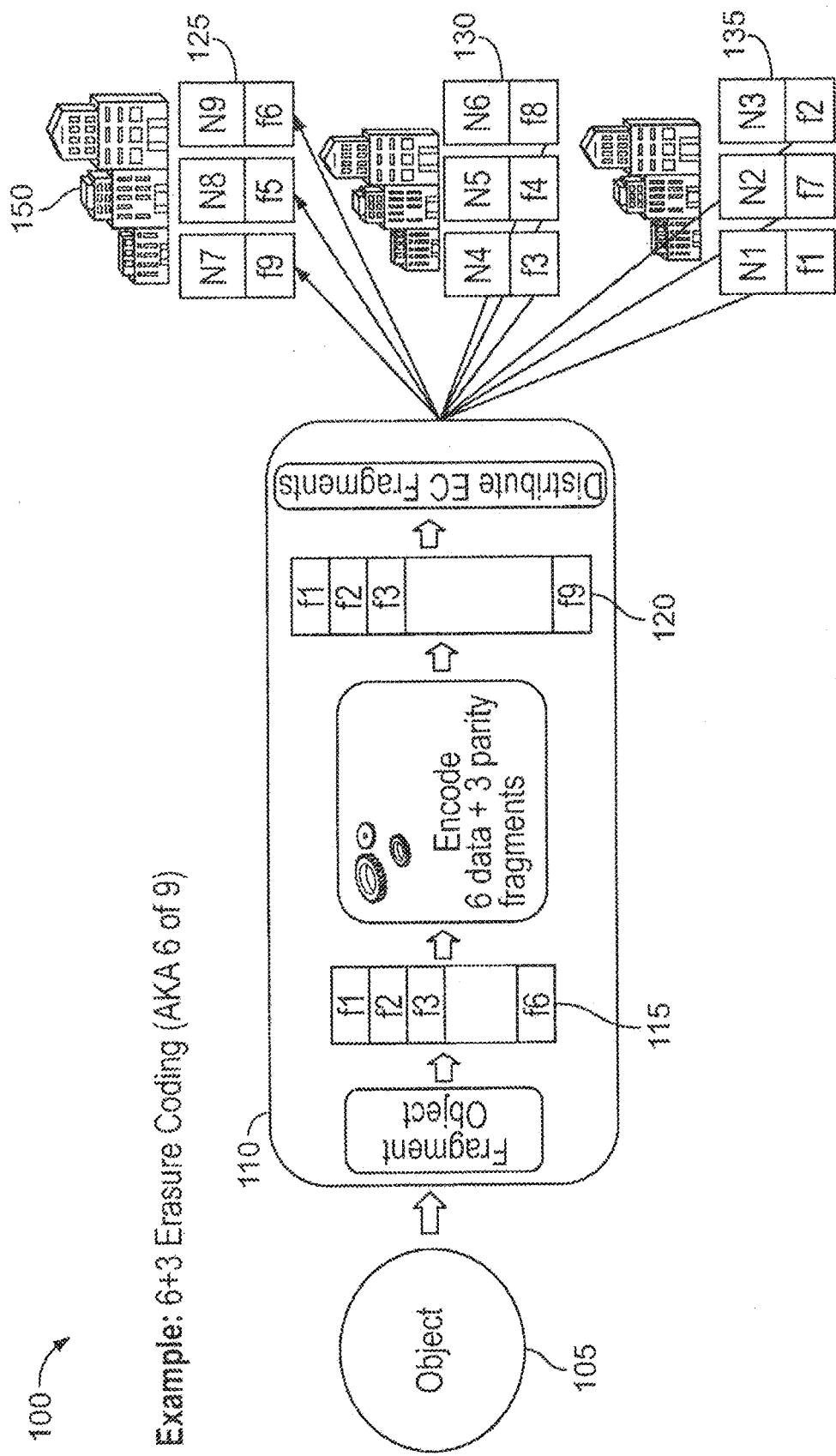
FIG. 1 is a block diagram illustrating an environment in which the disclosed embodiments can be implemented.

Technology is disclosed for virtual chunk service (VCS) based data storage in a distributed data storage system ("the technology"). The VCS based storage technique can improve efficiency in data storage and retrieval in the distributed data storage system ("distributed storage") while also facilitating data protection mechanisms. For example, the VCS based storage technique can be used in conjunction with an erasure coding method, which is typically an encoding scheme used for providing data protection and/or reliability. The VCS based storage technique, when used with the erasure coding method, can improve the efficiency in data recovery, e.g., by minimizing the computing resources used for recovering the lost data.

In the VCS based storage technique, a storage node ("node"), which is a computing device that facilitates storage of data in a persistent storage medium, is split into multiple VCSs and each of the VCSs can be assigned a unique ID in the distributed storage. A VCS is the smallest unit of a failure domain within a chunk service of the node. The unique ID of the VCS does not change during its lifetime. A set of VCSs from a set of nodes form a data storage group ("storage group"), which also can be assigned a unique ID in the distributed storage. When a data object is received for storage in the distributed storage, a storage group can be identified for the data object, the data object can be fragmented into multiple fragments and each fragment can be stored in a VCS of the identified storage group. For example, if a data object is stored using erasure coding method, the VCS based storage technique creates an erasure coding group ("ECG") as a storage group and associates a set of VCSs from a set of nodes with the ECG. When a data object is received for storage, the data object is erasure coded into multiple fragments and each fragment is stored in a VCS of the selected ECG.

ECGs are managed by a storage node acting as an erasure coding group manager ("ECGM"). In general, an ECGM manages storage space for erasure coded data which can involve performing various functions such as managing a total number of ECGs, creating new ECGs, marking existing ECGs as full, monitoring the health of ECGs, etc. Although all storage nodes may be configured with ECGM software, a single storage node is selected from a set of connected storage nodes to function as the ECGM. Once elected the selected storage node begins performing the functions of the ECGM, and the other storage nodes in the set submit requests for managing ECGs to the ECGM. For example, a storage node may request that the ECGM mark an ECG as full or mark an ECG as needing repair. In some instances, storage nodes within an ECG may be partitioned or cut off from the ECGM. For example, a partition of storage nodes may be created due to data center failures, storage node failures, network outages, etc. In such instances, a new ECGM needs to be elected to manage ECGs so that ingest of erasure coded data can continue.

Overview

To ensure that there is an ECGM among connected storage nodes, an ECGM election process is periodically performed among available storage nodes that are configured with the software to perform the services of an ECGM. When a storage node is activated, an ECGM process of the storage node begins executing and is assigned a process identifier ("PID"). A storage node can utilize a service query framework to identify other available storage nodes and retrieve their ECGM PIDs. The storage node then selects a PID according to a criterion and elects the storage node corresponding to the selected PID to be the acting ECGM. This process is performed periodically, so even if the acting ECGM storage node fails, a new ECGM is eventually selected from the available storage nodes. For example, in a collection of storage nodes across a first data center and a second data center, a single storage node at either the first or second data center is selected as the ECGM. If a network failure prevents communication between the two data centers, the election process described above will be performed, and a second ECGM will be elected: one ECGM among the nodes in the first data center and one ECGM among the nodes in the second data center.

Example Illustrations

FIG. 1 is a block diagram illustrating an environment 100 in which the disclosed embodiments can be implemented. The environment 100 includes a data management system 110 that provides data storage services, e.g., writing a data object to the distributed storage 150 and reading a data object from the distributed storage 150. The distributed storage 150 can include multiple storage nodes, e.g., nodes "N1"-"N9." Each storage node can be associated with one or more persistent storage devices to store the data object. In some embodiments, the persistent storage device can include storage media such as hard disk drives, magnetic tapes, optical disks such as CD-ROM or DVD-based storage, magneto-optical (MO) storage, flash-based storage devices such as solid state drives (SSDs), or any other type of non-volatile storage devices suitable for storing large quantities of data. The nodes can be distributed geographically. For example, a set of nodes "N1"-"N3" can be in a first location 135, "N4"-"N6" can be in a second location 130 and "N7"-"N9" can be in a third location 125. Further, different locations can have different number of nodes.

In some embodiments, the above described VCS based storage technique can be implemented using the data management system 110. Further, the VCS based storage technique can be implemented in association with the erasure coding method of storing the data. In some embodiments, the erasure coding method involves transforming a set of "k" fragments 115 of a data object, e.g., data object 105, into "n" erasure coded ("EC") fragments 120 by adding "m" parity fragments, where "n=k+m" (thus referred to as "k+m" erasure coding scheme). Some examples of "k+m" erasure coding scheme include "2+1", "6+3" and "8+2" erasure coding schemes. The data object 105 can be regenerated using a subset of the EC fragments 120. The "n" number of data fragments is spread across different nodes in a site and/or across sites. After the EC fragments 120 are generated, the EC fragments 120 are distributed to separate storage nodes for storage.

The data management system 110 enables implementing the VCS based storage technique in association with the erasure coding method. The data management system 110 organizes the distributed storage 150 into multiple logical layers, e.g., an ECG, one or more VCSs that belong to a specified ECG, and stores the EC fragments in a set of nodes having a set of VCSs of the specified ECG. Such storage of the data object enables data to be written, read and recovered in an event of data loss efficiently. In some embodiments, after a data object is stored in the distributed storage 150, the data management system generates various metadata. The metadata can include a mapping of the VCS to a storage node, which identifies a storage node a specified VCS belongs to or is hosted on. The metadata can also include a mapping of the ECG to the VCSs, which identifies a list of specified VCSs associated with an ECG. The metadata can also include a mapping of the VCS to data objects, which indicates the data objects (whose data fragments are) stored in a VCS. In some embodiments, the metadata service can also maintain a mapping of the ECGs to the data objects, which indicates the data objects stored in an ECG.

Figure 2A:
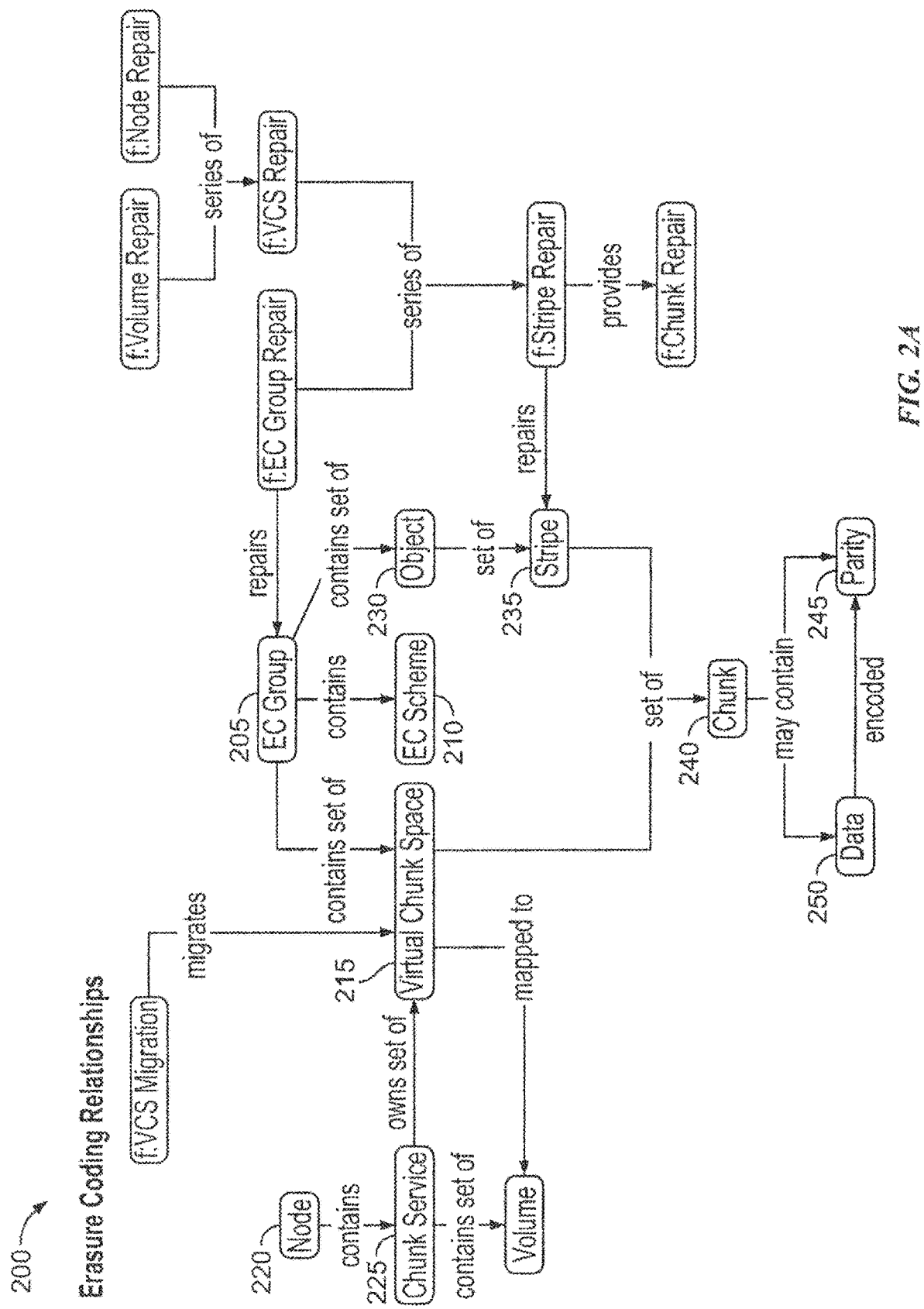
FIG. 2A is a block diagram illustrating a virtual chunk service (VCS) layout of a distributed storage of FIG. 1, consistent with various embodiments.

FIG. 2A is a block diagram illustrating a VCS layout of a distributed storage of FIG. 1, consistent with various embodiments. FIG. 2B is an example describing various layers of the VCS layout 200. A node can include or be considered as a chunk service, which can store a number of data chunks or fragments. The chunk service can be logically split into a specified number of VCSs. A VCS is the smallest unit of a failure domain within the chunk service and will have a unique identification (ID) which never changes during its lifetime. A set of VCSs spanning multiple storage nodes form an ECG. The size of a VCS can be determined in various ways, e.g., as a function of the erasure coding method used, number of storage nodes in the distributed storage 150, typical size of data objects stored in the distributed storage 150, etc. The number of VCSs in a storage node can also be determined in various ways, e.g., storage capacity of a storage node, storage capacity of the distributed storage 150, number of storage nodes.

Referring to FIG. 2A, the VCS layout 200 describes the layers in detail. The node 220 contains a chunk service 225. In some embodiments, the node 220 can be similar to one of the storage nodes in the distributed storage 150 of FIG. 1. The chunk service 225 on the node 220 can contain a set of VCSs 215. An ECG 205 can contain a set of VCSs, such as VCSs 215, spanning multiple nodes. For example, a first ECG contains a VCS each from node "N1," "N4" and "N5." Different ECGs can be formed based on a grouping profile or scheme 210. That is, the set of VCSs for a specified ECG can be selected from a specified set of nodes based on the grouping scheme 210. Further, the number of VCSs in the ECG can also be selected based on the grouping scheme 210. For example, the grouping scheme 210 can indicate that for a data object, e.g., data object 230, that is erasure coded using a "2+1" erasure coding scheme, an ECG should have three VCSs, one each from one of the nodes from a first location 135, a second location 130 and the third location 125. For example, the ECG contains a VCS each from node "N1," "N4" and "N5." In another example, if the erasure coding scheme used to store the data object is 230, is "6+3" erasure coding scheme, then the grouping scheme 210 can indicate that the ECG should have "9" VCSs, one from each of the nodes "N1"-"N9."

The data object can split into a number of slices or stripes 235, each stripe having a specified number of data fragments that is determined based on the erasure coding scheme. For example, in a "2+1" erasure coding, the stripe width is three, which means each stripe of the data object has "3" fragments 240, out of which "2" fragments are data fragments 250 and "1" fragment is a parity fragment 245. After the data object is erasure coded, the EC fragments of the data object 230 are stored in separate VCSs of the ECG group to which the data object is assigned, e.g., based on the grouping scheme 210.

Figure 3:
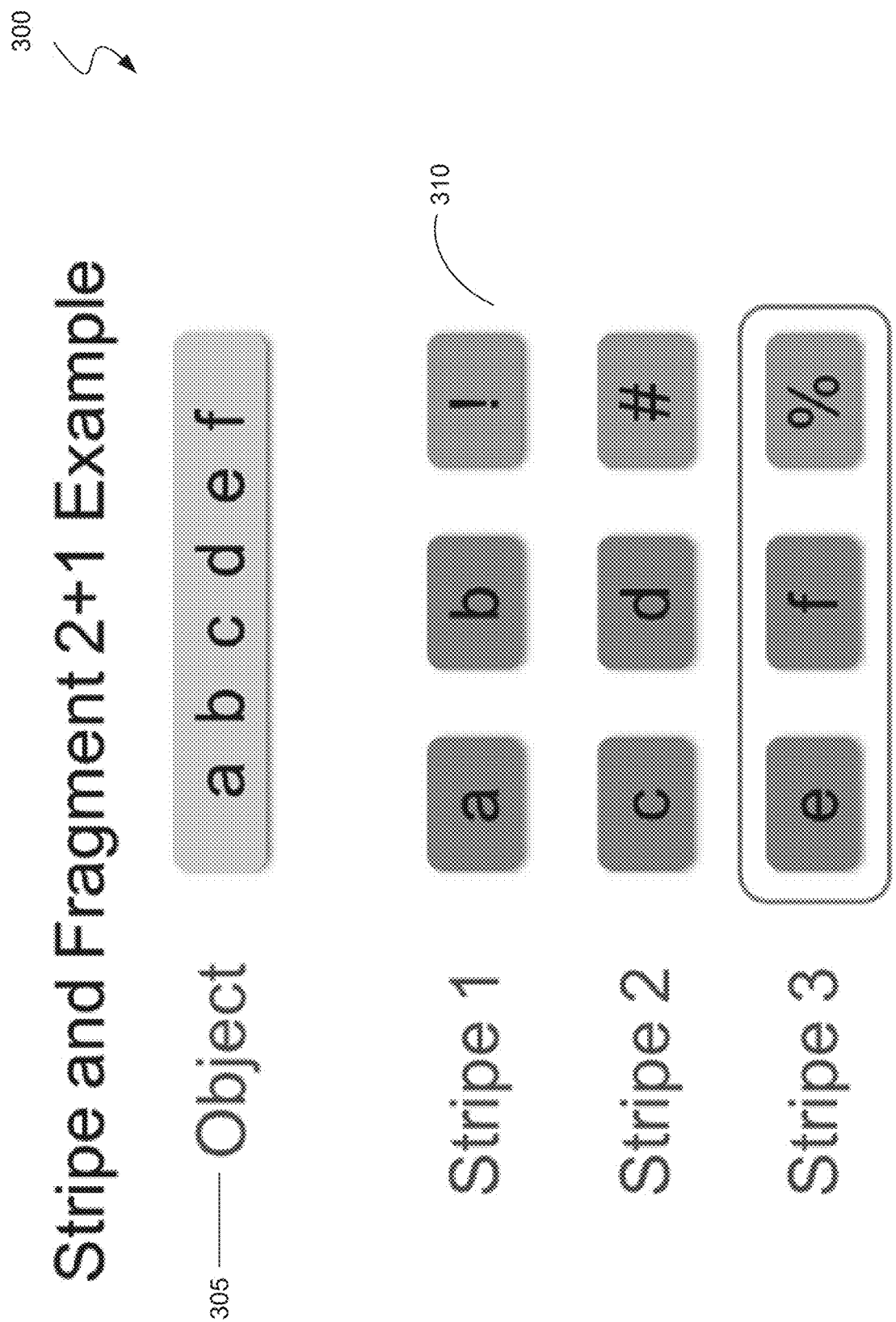
FIG. 3 is a block diagram of a process for erasure coding a data object using a "2+1" erasure coding scheme, consistent with various embodiments.

FIG. 3 is a block diagram of a process for erasure coding a data object using a "2+1" erasure coding scheme 300, consistent with various embodiments. In some embodiments, the data object 305 can be similar to the data object 105 of FIG. 1. The data object 305 can include "6" bytes of data. The data object 305 can be erasure coded using "2+1" erasure coding scheme. In some embodiments, "2+1" means "2" data and "1" parity fragments in a stripe. Using a 1 Byte fragment size, the data object 305 can be split into "3" stripes and "9" EC fragments 310 as illustrated. In the "2+1" scheme, 2 bytes/fragments are considered at a time and a third byte/fragment is added as parity to generate a stripe.

The EC fragments 310 can then be stored in VCSs of an ECG that can span multiple nodes, which can be situated in different geographical locations. In some embodiments, the EC fragments 310 can be similar to the EC fragments 120 of FIG. 1.

Figure 4:
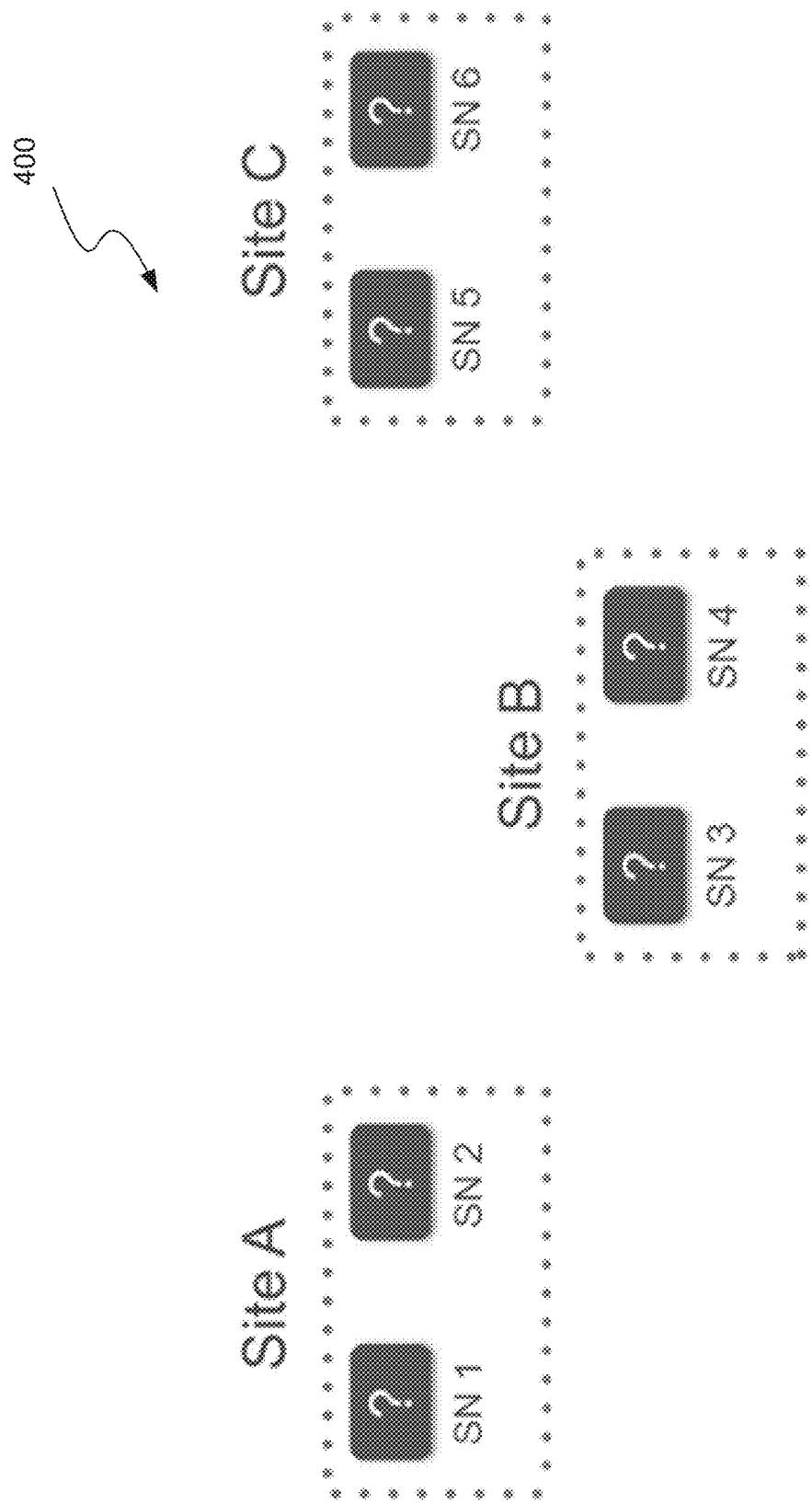
FIG. 4 is a block diagram illustrating an arrangement of storage nodes of a distributed storage system at various sites, consistent with various embodiments.

FIG. 4 is a block diagram illustrating arrangement 400 of nodes at various sites, consistent with various embodiments. In the arrangement 400, "6" nodes are located at various sites. For example, storage nodes "SN1" and "SN2" are located at site A, storage nodes "SN3" and "SN4" are located at site B, and storage nodes "SN5" and "SN6" are located at site C. A data management system, e.g., the data management system 110 of FIG. 1, can generate various ECGs that spread across various storage nodes in the arrangement 400, e.g., based on a grouping scheme.

Figure 5:
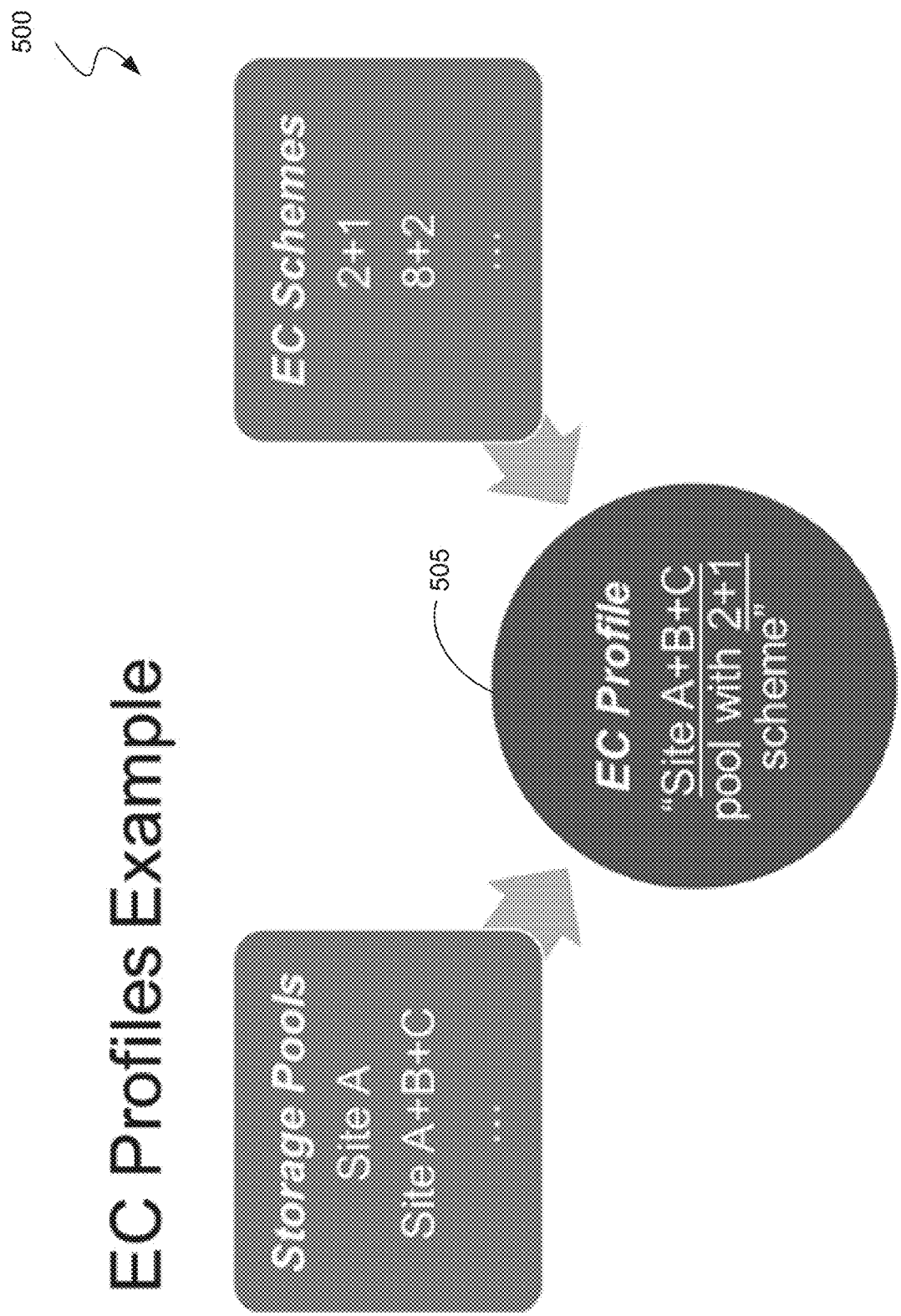
FIG. 5 is a block diagram illustrating an example grouping scheme, consistent with various embodiments.

FIG. 5 is a block diagram 500 illustrating an example grouping scheme 505, consistent with various embodiments. In some embodiments, the grouping scheme 505 can select the sites and the number of storage nodes based on the erasure coding scheme used. The data management system 110 can define a number of grouping schemes. For example, the data management system 110 can define a grouping scheme 505 that forms a storage pool by selecting a storage node from each of the sites A, B and C and to store data objects that are erasure coded using "2+1" erasure coding scheme. The data management system 110 can generate various ECGs per grouping scheme 505. Note that the "2+1" erasure coding scheme 300 is described for illustration purposes. The data object 305 can be erasure coded using other "k+m" erasure coding schemes.

Figure 6:
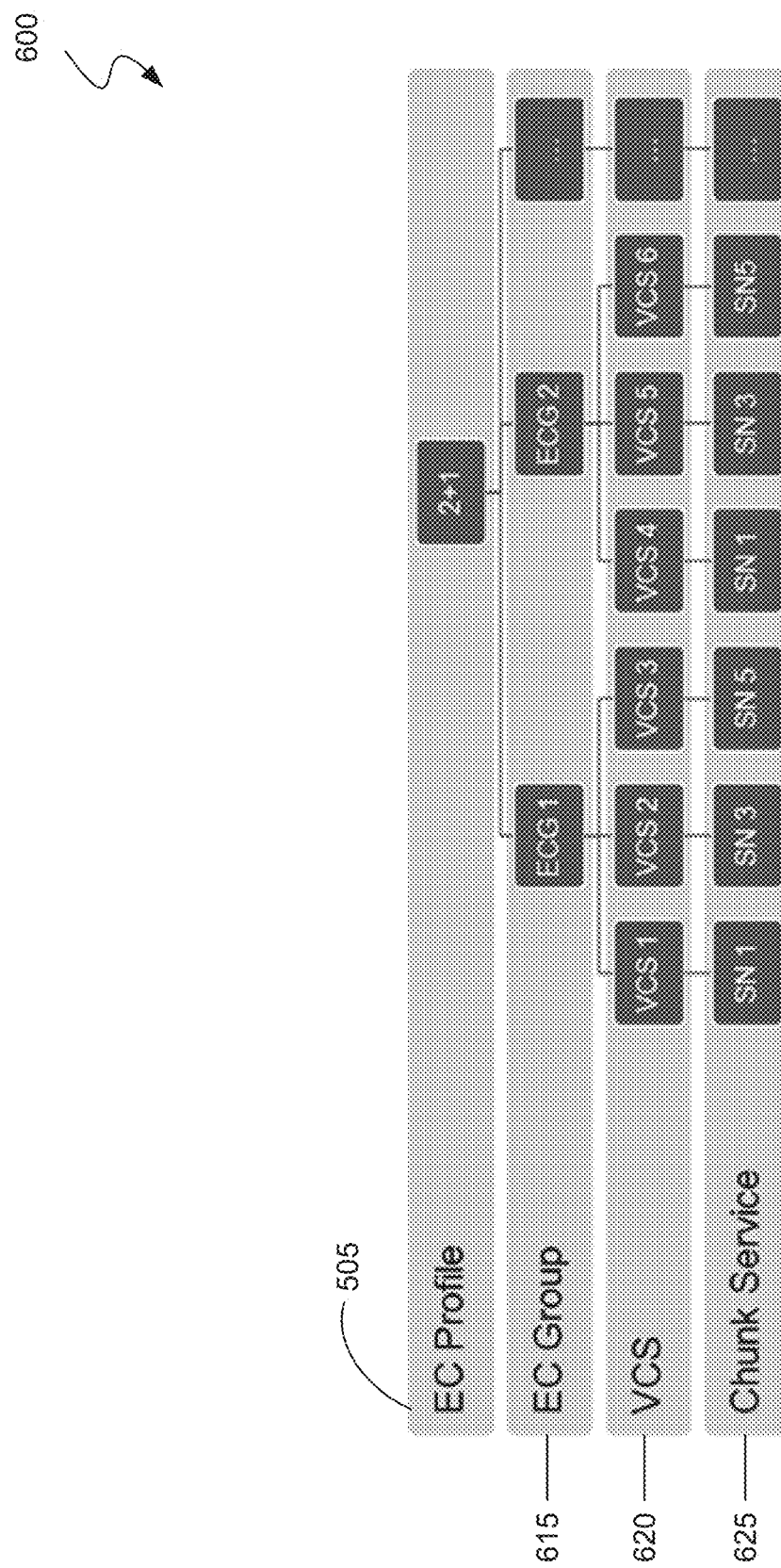
FIG. 6 is a block diagram illustrating an example of the VCS storage layout for storing data objects encoded using "2+1" erasure coding scheme, consistent with various embodiments.

FIG. 6 is a block diagram illustrating an example 600 of the VCS storage layout for storing data objects encoded using "2+1" erasure coding scheme, consistent with various embodiments. In the example 600, for the grouping scheme 505, the data management system 110 has generated a number of ECGs 610, e.g., "ECG 1" and "ECG 2." Further, "ECG 1" is allocated "3" VCSs 620 required for a "2+1" erasure coding scheme, e.g., "VCS 1," "VCS 2," and "VCS 3" from storage nodes 625 "SN1", "SN3" and "SN5," respectively. Note that the VCSs 620 for "ECG 1" are from storage nodes 625 at different sites, per the grouping scheme 505. Similarly, "ECG 2" is allocated "3" VCSs, e.g., "VCS 4," "VCS 5," and "VCS 6" from storage nodes "SN1", "SN3" and "SN5," respectively. The storage nodes 625 can be similar to one or more of the storage nodes in the arrangement 400 of FIG. 4.

After the VCS storage layout is determined, the data management system 110 can generate various mappings, e.g., as metadata. The metadata can include a mapping of the VCS to a storage node, which identifies a storage node a specified VCS belongs to. For example, referring to the VCS storage layout of example 600, the VCS→node mapping for storage node "SN 1" can include "SN 1→VCS 1, VCS 4 . . . " or "VCS 1→SN 1" "VCS 4→SN 1" etc. The metadata can also include a mapping of the ECG to the VCSs, which identifies a list of specified VCSs associated with an ECG. For example, referring to example 600, the ECG→VCS mapping for "ECG 1" can include "ECG 1→VCS 1, VCS 2, VCS 3."

The data management system 110 assigns a data object to a particular ECG, and stores all stripes of the data object in the same ECG. However, each fragment is stored in a separate VCS of the ECG. For example, referring to the data object 305 of FIG. 3, if the data object 305 is assigned to "ECG 1," then each fragment of a stripe is stored in a separate VCS—data fragment "a" in "VCS 1," data fragment "b" in "VCS 2," and data fragment "!" in "VCS 3." All other stripes of the data object 305 can be stored in "ECG 1" similarly.

The data management system 110 can also generate metadata for the data storage object, which indicates the list of objects or fragments of the object in a specified VCS. For example, if data objects "Obj 1," "Obj 2," "Obj 3," and "Obj 4" are stored in the VCSs of "ECG 1," then a VCS→Obj mapping can include "VCS 1→Obj 1, Obj 2, Obj 3, Obj 4". In some embodiments, the metadata service can also maintain a mapping of the data objects to the ECGs, which identifies an ECG in which a specified data object is stored. Continuing with the above example of storing data objects "Obj 1"-"Obj 4" in "ECG 1," an ECG→Obj mapping can include "ECG 1→Obj 1, Obj 2, Obj 3, Obj 4".

FIG. 7 is a table 700 of storage nodes and ECGs showing data fragments of different objects stored at different storage nodes, consistent with various embodiments. In the table 700, various ECGs are assigned VCSs from various storage nodes. For example, "EC Group 1" is allocated "3" VCSs, e.g., from storage nodes "SN1", "SN3" and "SN5," respectively. Similarly, "EC Group 2" is allocated "3" VCSs, e.g., from storage nodes "SN1", "SN3" and "SN6" respectively.

Figure 8:
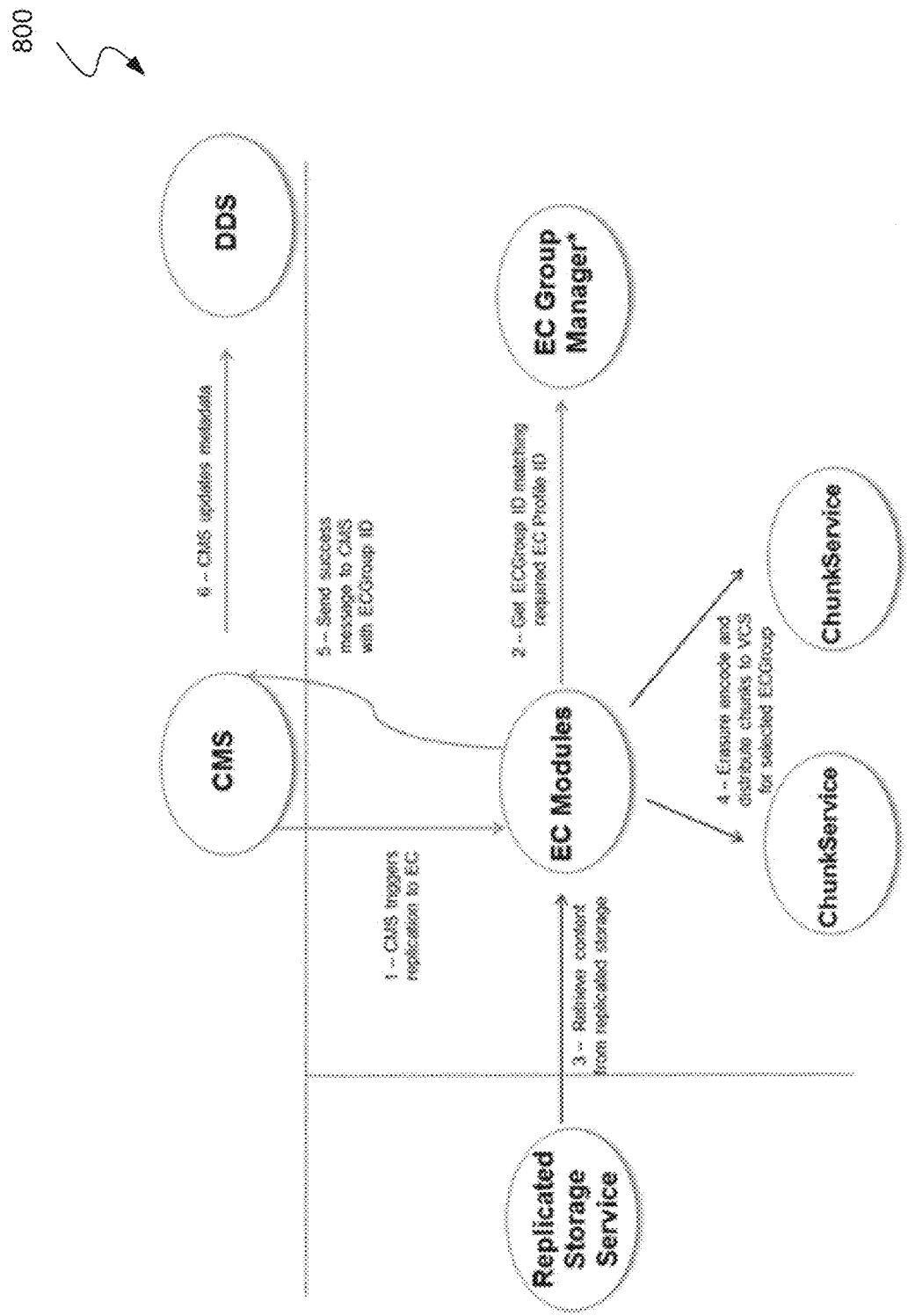
FIG. 8 is a flow diagram of a process for writing a data object to the distributed storage of FIG. 1, consistent with various embodiments.

FIG. 8 is a flow diagram of a process 800 for writing a data object to the distributed storage of FIG. 1, consistent with various embodiments. In some embodiments, the process 800 can be implemented in the environment 100 of FIG. 1 and using the data management system 110. At step 1, a content management service (CMS) module 805 associated with the data management system 110 initiates a write operation for a data object, e.g., data object 305. In some embodiments, the CMS module 805 directs placement of objects into the distributed data storage system. In some embodiments, the CMS module 805 can include information regarding the grouping scheme to be applied to the data object. In some embodiments, the grouping scheme may be determined by the CMS module 805 based on a type of application issuing the write request, a type of the data object, etc. In some embodiments, the grouping scheme can be defined by a user, e.g., an administrator of the data management system 110, and stored in the form of a data protection policy. At step 2, an EC module 810 associated with the data management system 110 obtains, e.g., from an EC group manager 815, an ECG that satisfies the provided grouping scheme, e.g., "ECG1". In some embodiments, the EC group manager 815 generates the ECGs, e.g., ECGs 610, based on the grouping scheme. At step 3, the EC module 810 retrieves the data object, e.g., from a replication storage service, from one or more sources where the data object is stored, e.g., the data object 305 to be erasure coded.

At step 4, the EC module 810 erasure codes the data object, e . . . based on a erasure coding scheme to generate the EC fragments, e.g., EC fragments 310, and transmits the EC fragments to the VCSs of the selected ECG. The chunk service on the storage nodes that are part of the selected ECG receives the VCSs and stores at them at the persistent storage medium associated with the storage nodes. At step 5, upon successful writing of the EC fragments to the VCSs, the EC module 810 can send a success message to the CMS module 805. In some embodiments, the EC module 810 also provides the IDs of the VCSs where the data object fragments are stored to the CMS module 805, e.g., as part of the success message. At step 6, the CMS module 805 provides the VCSs and/or the ECG information of the data object to a metadata service, e.g., a distributed data service (DDS) module 820, to update the metadata, e.g., in a metadata store. The metadata can include the IDs of the VCSs and/or the ECG where the data object fragments are stored. In some embodiments, the CMS module 805 can update the metadata of the data object in the metadata store without using the DDS module 820.

Figure 9:
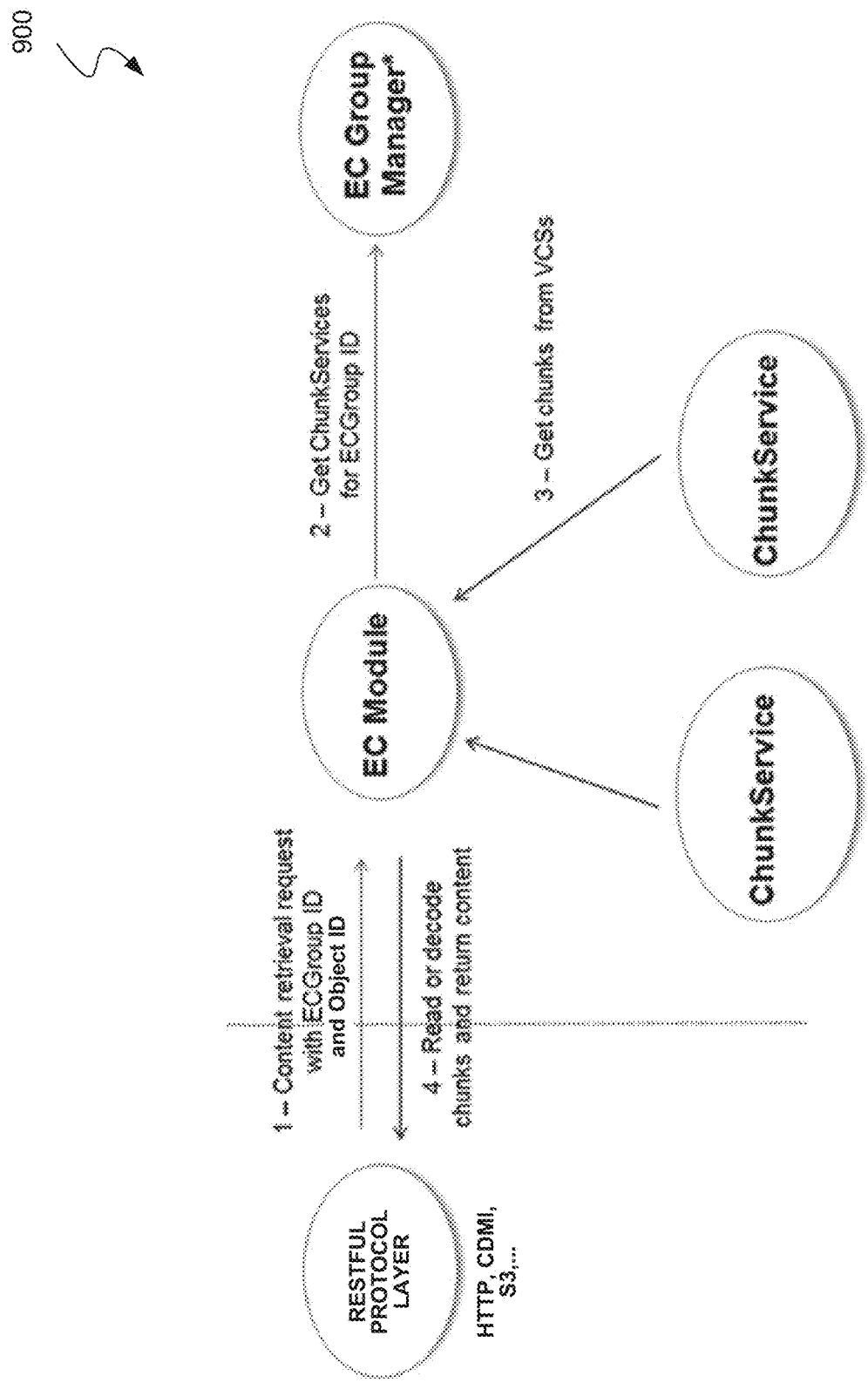
FIG. 9 is a flow diagram of a process for reading data from the distributed storage of FIG. 1, consistent with various embodiments.

FIG. 9 is a flow diagram of a process 900 for reading data from the distributed storage of FIG. 1, consistent with various embodiments. In some embodiments, the process 900 may be implemented in environment 100 of FIG. 1. At step 1, the EC module 810 receives a read request from a requesting entity for retrieving a data object. In some embodiments, the read request includes the object ID of the data object and/or the ECG ID of the ECG to which the data object is assigned. In some embodiments, the requesting entity can be a client computer ("client") which sends the read and/or write request using one or more protocols, e.g., hyper-text transfer protocol (HTTP).

At step 2, the EC module 810 obtains the IDs of the VCSs in which the data object is stored, e.g., from the EC group manager 815. In some embodiments, the EC group manager 815 uses the DDS module 820 to obtain the VCSs storing the data object. The DDS module 820 can identify the VCSs in which the data object is stored by searching the ECG→VCS mapping and/or the VCS→object mapping metadata using the object ID and any ECG ID provided in the request.

After identifying the VCSs, at step 3, the EC module 810 obtains all or a subset of the data fragments of the data object from the identified VCSs. At step 4, the EC module 810 decodes the data fragments, e.g., based on the erasure coding scheme used to encode the data object, to reconstruct the data object, and returns the reconstructed data object to the requesting entity.

Note that the data management system 110 can include additional modules or lesser number of modules than illustrated in FIGS. 8 and 9. For example, the additional modules can perform other functionalities than described above. In another example, the functionalities of one or more of the above modules can be split into two or more additional modules. Further, functionalities of two or more modules can be combined into one module.

Figure 10:
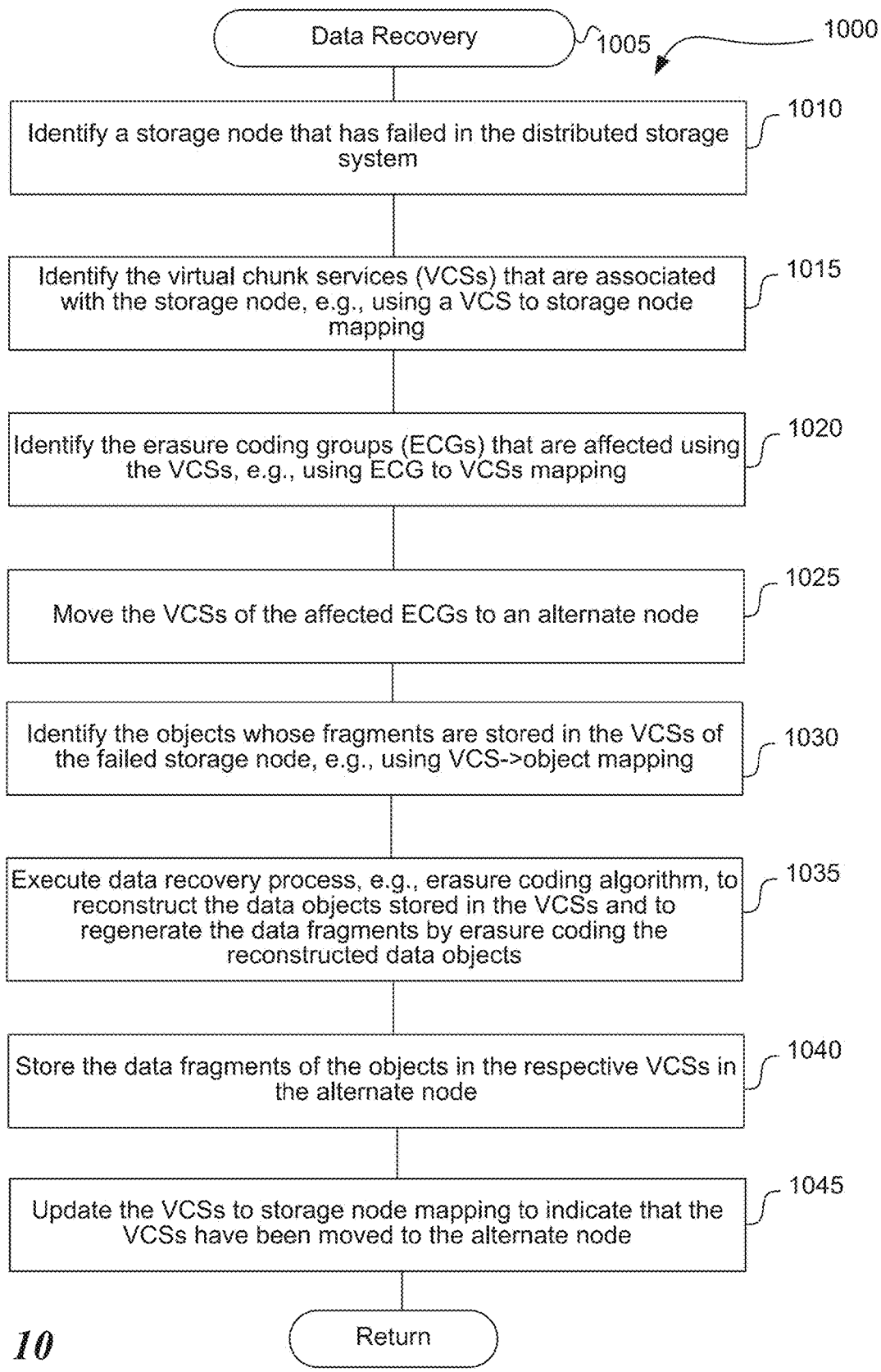
FIG. 10 is a flow diagram of a process for recovering lost data in the distributed storage of FIG. 1, consistent with various embodiments.

FIG. 10 is a flow diagram of a process 1000 for recovering lost data in the distributed storage of FIG. 1, consistent with various embodiments. In some embodiments, the process 1000 may be implemented in environment 100 of FIG. 1. The data in the distributed storage 150 can be lost due to various reasons, e.g., failure of a storage node, failure of a portion of the storage node, failure of a site. For the sake of convenience, the data recovery process 1000 is described with respect to data loss due to a failure of a storage node in the distributed storage 150. However, the process 1000 can be implemented for other types of data losses as well. The process 1000 begins at block 1005, and at block 1010, the EC module 810 identifies a storage node that has failed in the distributed storage 150 ("failed storage node").

At block 1015, the EC module 810 identifies the VCSs that are associated with the failed storage node using the metadata. For example, the EC module 810 requests the DDS module 820 to obtain the IDs of the VCSs associated with failed storage node, and the DDS module 820 uses the metadata, e.g., VCS to storage node mapping described above, to obtain the VCS IDs.

At block 1020, the EC module 810 identifies the ECGs that are affected due to storage node failure. In some embodiments, the EC module 810 requests the DDS module 820 to obtain the IDs of the ECG associated with the storage node. The DDS module 820 can use the IDs of the VCSs identified in the block 1015 to identify the affected ECGs, e.g., based on the ECG to VCS mapping metadata.

At block 1025, the EC module 810 reassigns the VCSs of the affected ECGs to an alternate node(s). In some embodiments, reassigning the VCSs to the alternate node can include reassigning the VCSs on the failed storage node to the alternate node such that this reassignment continues to satisfy the data protection requirements of the ECG. These reassigned VCSs can start off empty until data fragments that belonged to them before the storage node failure are regenerated, e.g., as described in block 1035.

At block 1030, the EC module 810 identifies the objects whose fragments are stored in the VCSs (and/or ECGs) of the failed storage node, e.g., using the VCS→object mapping metadata and/or ECG→object mapping metadata. Recall, e.g., from FIG. 8, that when the data object is stored in the distributed storage 150, the object metadata is updated to indicate the VCSs in which the fragments of the data object are stored.

After identifying the data objects whose fragments are stored in the affected VCSs, at block 1035, the EC module 810 executes a data recovery process. The data recovery process can include executing erasure coding algorithm on the data object fragments stored in the VCSs to reconstruct the data objects and then to regenerate the data fragments by erasure coding the reconstructed data objects.

At block 1040, the EC module 810 stores the data fragments of the data objects in the respective VCSs in the alternate node.

At block 1045, the DDS module 820 can update the VCSs to storage node mapping to indicate that the VCSs have been moved to the alternate node, and the process 1000 returns. In some embodiments, the EC module 810 can send a success message to the CMS module 805 along with one or more of object ID, VCS ID and storage node ID. The CMS module 805 can then instruct the DDS module 820 to update the VCSs to storage node mapping accordingly.

Referring back to blocks 1035 and 1040, in some embodiments, the data management system 110 can reconstruct all the data objects stored in the affected ECGs by one ECG at a time and one stripe of a data object at a time. The reconstructed stripes can be erasure encoded to regenerate data fragments belonging to the VCSs that were reassigned in block 1025 after the storage node failure. In some embodiments, the blocks 1035 and 1040 are executed serially for each stripe of every ECG to be repaired.

The data recovery process described above may not have to update the metadata of the impacted data objects as the fragments of those data objects are still stored in the same VCSs as before the failure; only the VCS-storage node mapping may need to be updated as the VCSs are moved to the alternate node. Therefore, by eliminating the need to update the metadata of all the impacted data objects, the VCS based storage technique minimizes the computing resources consumed for updating the metadata, thereby improving the efficiency of a data recovery process. Further, since the data objects stored on the failed node can be identified using the VCS→storage node mapping and VCS→data objects mapping, the process can eliminate the need to read the metadata of all the data objects to determine if a fragment of the data object is stored in the failed node, thereby saving the computing resources required for performing the read operation.

Figure 11:
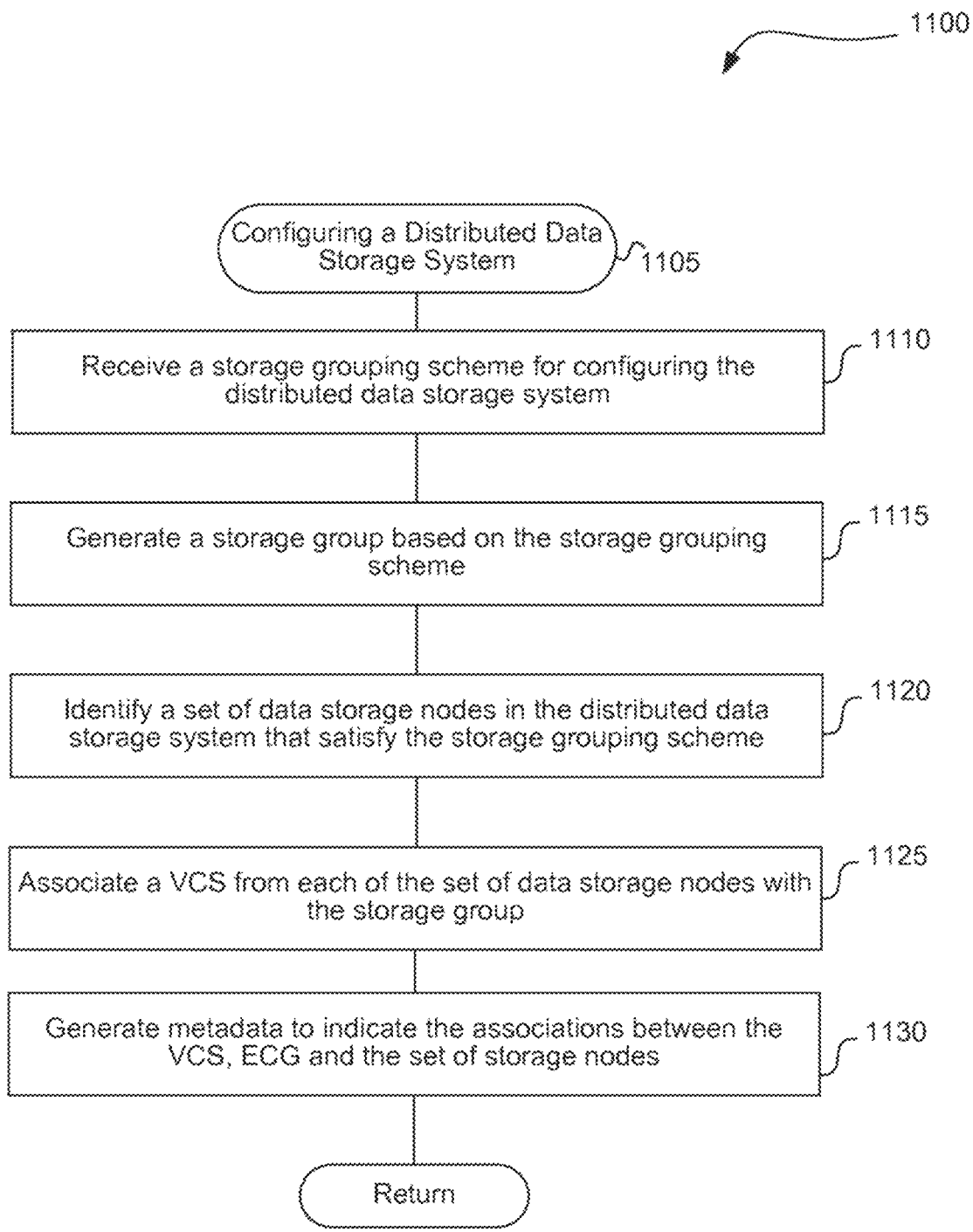
FIG. 11 is a flow diagram of a process for configuring a VCS storage layout of the distributed storage of FIG. 1, consistent with various embodiments.

FIG. 11 is a flow diagram of a process 1100 for configuring a VCS storage layout of the distributed storage of FIG. 1, consistent with various embodiments. In some embodiments, the process 1100 may be implemented in environment 100 of FIG. 1. The process 1100 begins at block 1105, and at block 1110, the EC group manager 815 receives a storage grouping scheme, e.g., grouping scheme 505, for configuring the distributed storage 150. In some embodiments, the grouping scheme 505 can include information regarding storage nodes, e.g., the storage sites to be selected for a storage group, the number of storage nodes to be selected and the number of storage nodes to be selected from a storage site. In some embodiments, the grouping scheme define the selection of the storage sites and/or nodes based on an erasure coding scheme to be used. For example, the grouping scheme 505 indicates that for a "2+1" erasure coding scheme, a storage pool is to be created by selecting a node from each of the sites A, B and C, which means that an object erasure coded using "2+1" erasure coding scheme is to be stored at the selected nodes in sites A, B and C. The data management system 110 can facilitate defining a number of grouping schemes.

At block 1115, the EC group manager 815 generates a storage group, e.g., "ECG 1" based on the storage grouping scheme, and assigns a unique ID to the storage group.

At block 1120, the EC group manager 815 identifies a set of the nodes in the distributed storage 150 that satisfy the grouping scheme.

At block 1125, the EC group manager 815 associates a VCS from each of the identified nodes with the storage group.

At block 1130, the DDS module 820 generates various metadata indicating the associations between the VCS, storage group and the nodes, and the process 1100 returns. For example, the DDS module 820 generates an ECG→VCS mapping metadata that indicates the VCSs associated with a particular storage group. In some embodiments, the DDS module 820 generates a VCS→node mapping metadata when a storage node is deployed into the distributed storage 150 and the chunk service splits the storage node into VCSs.

Figure 12:
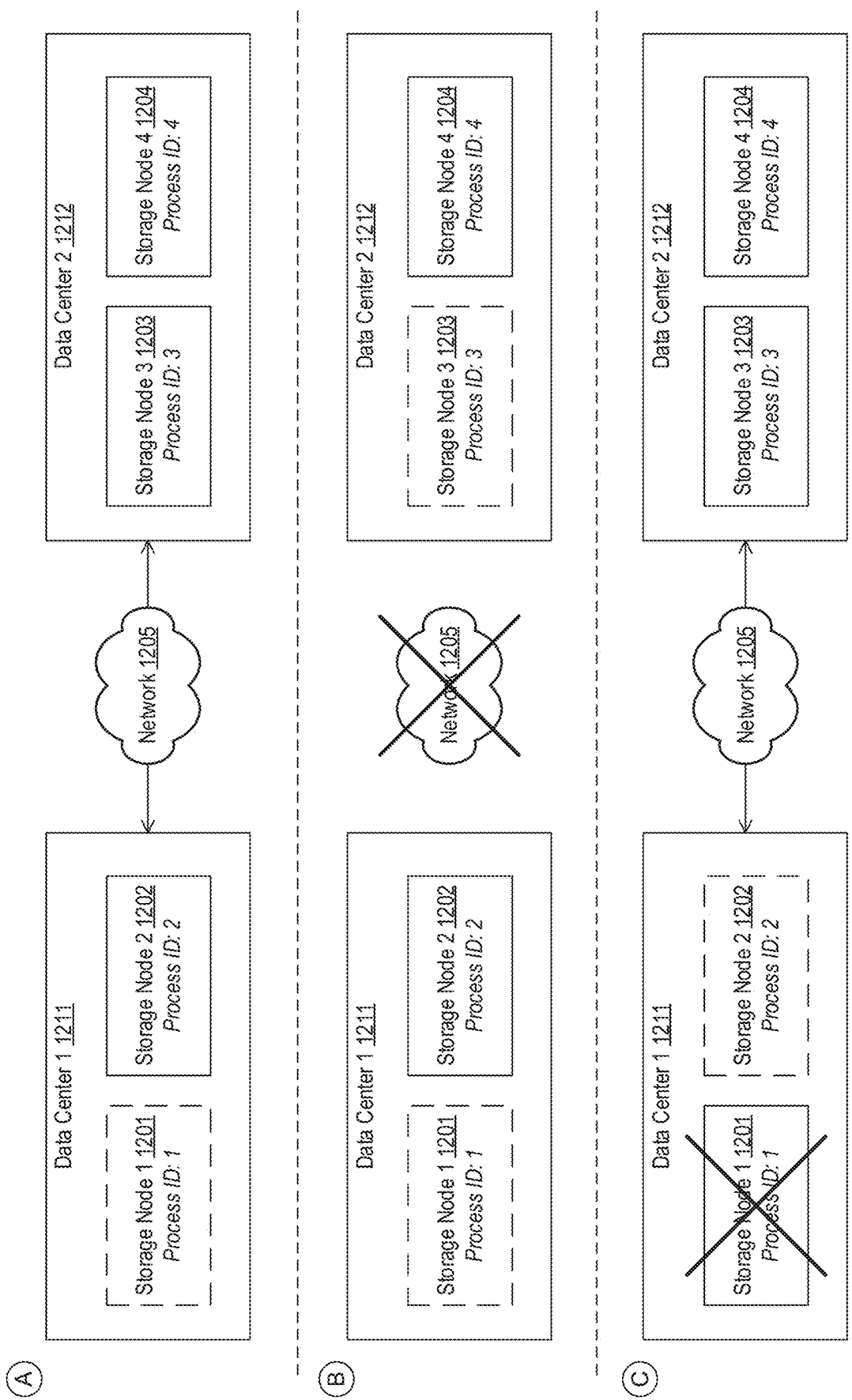
FIG. 12 depicts election of an ECGM in a collection of storage nodes as the storage nodes are partitioned and merged.

FIG. 12 depicts election of an ECGM in a collection of storage nodes as the storage nodes are partitioned and merged. FIG. 12 depicts a data center 1 1211 and a data center 2 1212. The data center 1 1211 includes a storage node 1 1201 and a storage node 2 1202, and the data center 2 1212 includes a storage node 3 1203 and a storage node 4 1204. The data centers and their respective storage nodes communicate through a network 1205.

Each storage node is depicted with a PID corresponding to an ECGM process executing on the storage node. PIDs are assigned by a runtime environment of the storage node. For example, an operating system on the storage node may assign the ECGM process a PID. The ECGM process and PID of each storage node can be registered with a service framework that monitors active processes among the collection of storage nodes. The service framework facilitates communications among the processes by allowing a device to query the service framework to retrieve PIDs and identify active storage nodes or other active components within a network. The service framework may execute on one or more servers (not depicted) in the network 1205. In implementations without a service framework, the storage nodes may share PIDs among themselves in accordance with a network discovery protocol. For example, the storage node 1 1201 may broadcast a message to each of the other storage nodes requesting a PID for the ECGM process. The storage nodes can supply their PID as well as any other PIDs they may have discovered. In this way, each storage node maintains its own table of active PIDs that is refreshed periodically as PIDs are shared among the storage nodes.

At stage A, the storage node 1 1201 is elected as the acting ECGM for the collection of storage nodes as indicated by the dashed lines. In FIG. 12, each storage node retrieves the PIDs of the other storage nodes and evaluates the PIDs to identify the lowest value PID. The storage node 1 1201 is elected as the ECGM based on the storage node 1 1201 having the lowest PID among the storage nodes. Because each storage node performs this process, each storage node can independently identify the ECGM and does not need to be notified of which storage node is the ECGM. Additionally, a storage node can determine when it should begin acting as the ECGM. The storage node 1 1201, for example, begins acting as the ECGM based on determining that its PID is equal to the lowest PID among the collection of storage nodes. After the election of the storage node 1 1201 as the ECGM, the other storage nodes begin directing ECG management requests to the storage node 1 1201.

At stage B, the collection of storage nodes becomes partitioned due to the failure of the network 1205. Specifically, the data center 1 1211 cannot communicate with the data center 2 1212, so the storage node 3 1203 and the storage node 4 1204 can no longer communicate with the ECGM process on the storage node 1 1201. As a result, while the storage node 1 1201 continues serving as the ECGM for the storage node 2 1202, a new ECGM will be selected for the partition of the storage node 3 1203 and the storage node 4 1204 so that ingest of EC data can continue at the data center 2 1212. To elect a new ECGM, the storage node 3 1203 and the storage node 4 1204 reperform the election process as described above. The storage node 3 1203 is elected the ECGM based on the storage node 3 1203 having the lowest PID of the two storage nodes.

Reperforming the election process may be triggered by detecting that the previous ECGM, the storage node 1 1201, can no longer be reached. Alternatively, in some implementations, each storage node performs the election process periodically. In such implementations, there can be a period of time after a storage node partition occurs when storage nodes are not in communication with an elected ECGM. During this period, storage nodes, such as the storage node 3 1203 and the storage node 4 1204, may act as their own ECGM using their local ECGM process. However, each storage node acting as its own ECGM can lead to excessive creation of new ECGs, thereby increasing an amount of metadata to be managed. As a result, a single node should eventually be elected to act as the single ECGM for each partition of storage nodes. This election will occur upon the next periodic execution of the election process. For example, the storage nodes may perform the election process every 10 minutes. The ultimate result of performing the election process is that a single ECGM will be selected for each partition of the storage nodes. In FIG. 12, the storage node 1 1201 and the storage node 3 1203 both act as ECGMs for the nodes in their respective data centers or partitions.

At stage C, the network 1205 has been restored enabling communication between the data center 1 1211 and the data center 2 1212, and the storage node 1 1201 has failed. Due to the repair of the network 1205, the storage nodes in their respective data centers have merged and are no longer partitioned as described at stage B, so a single ECGM for the collection of storage nodes can again be elected. This election of a single ECGM will occur automatically upon the next execution of the election process. However, because the storage node 1 1201 has failed, the storage node 1 1201 will not be considered during the next election process. As a result, the storage node 2 1202 will be elected as ECGM due to the storage node 2 1202 have the next lowest PID. In the event that the storage node 1 1201 becomes functional again, the storage node 1 1201 may again be elected as the ECGM upon the next execution of the election process. However, a storage node's runtime environment assigns a new PID upon each restart of a storage node; as a result, the storage node 1 1201 may no longer be the ECGM if its new PID is not the lowest among the storage nodes.

Figure 13:
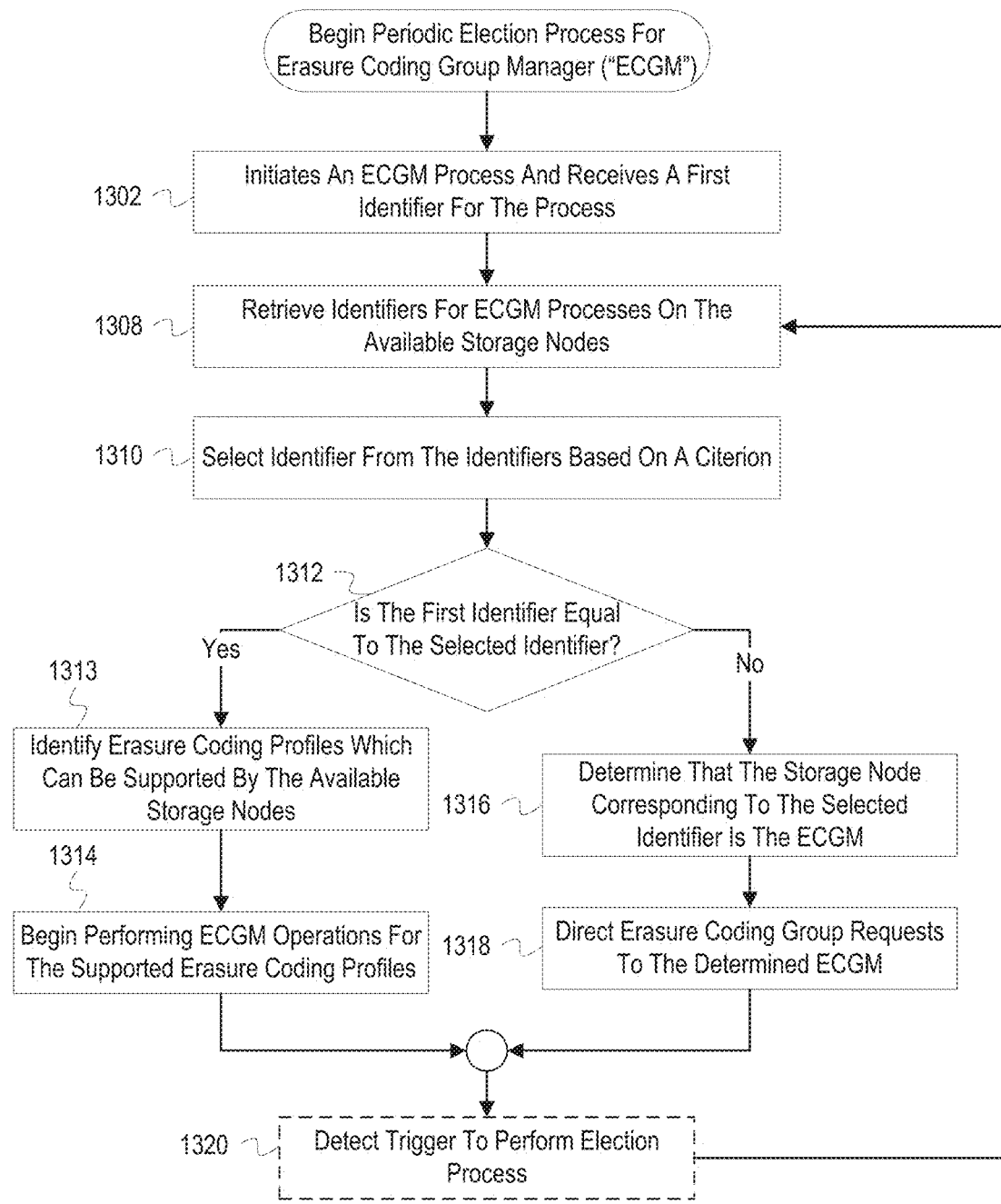
FIG. 13 depicts a flowchart with example operations for performing an election process for an ECGM among available storage nodes.

FIG. 13 depicts a flowchart with example operations for performing an election process for an ECGM among available storage nodes. FIG. 13 describes a storage node as performing the operations, although the operations may be performed by other components or software processes.

At block 1302, the storage node ("node") initiates an ECGM process and receives a first identifier for the process. When the node is activated, a runtime environment of the node begins executing the ECGM process and assigns the process the first identifier. A PID is typically numerical, although the identifier may be alphanumerical, alphabetical, etc. The node can register or publish the ECGM process with the first identifier to a service framework that monitors available processes among a collection of storage nodes. In some implementations, the storage node may broadcast a message to storage nodes in a same network indicating that the ECGM process has come online along with the first identifier.

At block 1308, the node retrieves identifiers for ECGM processes on the available storage nodes. The node can retrieve the ECGM process identifiers from the service framework or through discovery by submitting queries to other storage nodes in the network. For example, similar to network discovery protocols used by routers, the node may identify and monitor other nodes on the network and maintain a table of identifiers for active ECGM processes.

At block 1310, the node selects an identifier from the retrieved identifiers based on a criterion. The node may sort the retrieved identifiers and select an identifier based on a criterion such as the highest value identifier or lowest identifier value. If the identifiers are alphabetical, the node may sort the identifiers alphabetically and select an identifier based on its location in the alphabet. By selecting an identifier, the node is electing the corresponding storage node to act as the ECGM. Other criteria for selecting a storage node to act as ECGM are possible. In some implementations, the node can elect a storage node to be ECGM based on criteria, such as which storage node has the most available computing power, which storage node has the most available storage, etc. The node can retrieve these performance measurements through the communication with other nodes, the service framework, storage system management software, etc.

At block 1312, the node determines whether the first identifier is equal to the selected identifier. The first identifier corresponds to the node's own ECGM process, so the node compares the first identifier to the identifier selected at block 1310 to determine whether it should begin acting as the ECGM. If the first identifier is equal to the selected identifier, the node begins acting as the ECGM.

At block 1313, the node identifies EC profiles which can be supported by the available storage nodes. The node may be configured with a number of EC profiles or grouping schemes such as the ones described in FIG. 5 above. An EC profile or grouping scheme can indicate a minimum number of storage nodes needed based on an erasure coding scheme used. The node determines a minimum number of storage nodes needed for each EC profile and queries the service framework to determine a number of available storage nodes. If the number of available storage nodes exceeds or equals the minimum number of storage nodes needed, the node determines that there is a sufficient number of available storage nodes to satisfy or support the EC profile. If the number of available storage nodes is less than the minimum number of storage nodes needed, the node determines that there is not a sufficient number of available storage nodes to satisfy the particular EC profile. For EC profiles which cannot be satisfied, the node may send a message to an administrative console or other storage system monitoring software indicating the unsupported EC profiles.

At block 1314, the node begins performing ECGM operations for the supported EC profiles. The node begins managing ECGs in the supported EC profiles by performing ECGM functions such as monitoring the health of ECGs, creating new ECGs, marking ECGs as full, etc. If the node was elected ECGM after a failure of storage nodes or after a network failure, the node may begin by creating a new ECG across the available storage nodes to create storage space for new EC data ingest. The node may also be processing data access requests such as read requests and delete requests at the same time. For delete requests, the node deletes the EC fragments corresponding to a data object indicated in a delete request. However, this is a best effort operation as the node can only delete EC fragments across available storage nodes and may be unable to delete all EC fragments if some storage nodes are unavailable.

At block 1316, if the first identifier is not equal to the selected identifier, the node determines that the storage node corresponding to the selected identifier is the ECGM. The node records the storage node corresponding to the selected identifier as the acting ECGM by storing the selected identifier as the destination for ECGM requests. Additionally, the node may query the service framework or the storage node corresponding to the selected identifier to retrieve additional information, such as a storage node identifier or Internet Protocol (IP) address.

At block 1318, the node directs ECG requests to the determined storage node acting as ECGM. For example, the node may request that the ECGM mark an ECG as full, create a new ECG, mark that an ECG needs repair, etc.

At block 1320, the node detects a trigger to reperform the election process. As indicated by the dashed lines, the operations of block 320 may be performed as a background process that executes while other operations as described above are performed. The node may be configured to perform the election process periodically, so the trigger to reperform the election process may be the expiration of a period of time. In some implementations, the node may be triggered to perform the election process after detecting that the acting ECGM can no longer be reached or is not responding, after detecting a network failure, or after detecting that communication among storage nodes has been restored. After detecting the trigger, the node begins performing the election process again by performing the operations of block 1304.

Because the above described election process is performed among available storage nodes, each collection or set of storage nodes in communication with each other will have a single ECGM. If the collection of storage nodes is partitioned due to node or network failure, the periodic performance of the ECGM election process ensures that the partitioned groups can each elect their own ECGM and continue functioning. Similarly, as groups of storage nodes with their own ECGMs are merged, the election process ensures that the number of storage nodes elected as ECGM is reduced to a single storage node acting as ECGM.

Figure 14:
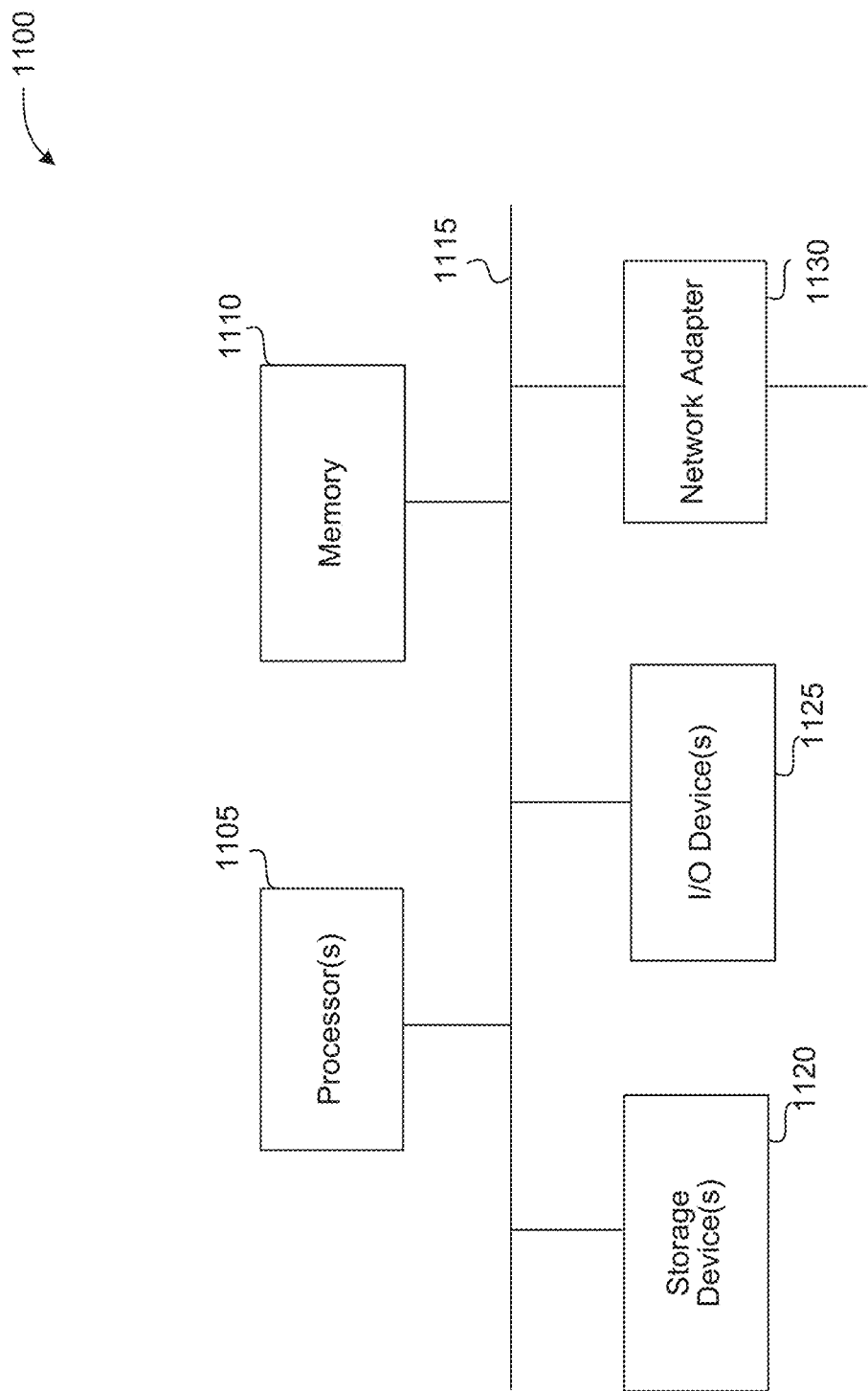
FIG. 14 is a block diagram of a computer system as may be used to implement features of some embodiments of the disclosed technology.

FIG. 14 is a block diagram of a computer system as may be used to implement features of some embodiments of the disclosed technology. The computing system 1400 may be used to implement any of the entities, components or services depicted in the examples of the foregoing figures (and any other components described in this specification). The computing system 1400 may include one or more central processing units ("processors") 1405, memory 1410, input/output devices 1425 (e.g., keyboard and pointing devices, display devices), storage devices 1420 (e.g., disk drives), and network adapters 1430 (e.g., network interfaces) that are connected to an interconnect 1415. The interconnect 1415 is illustrated as an abstraction that represents any one or more separate physical buses, point to point connections, or both connected by appropriate bridges, adapters, or controllers. The interconnect 1415, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire".

The memory 1410 and storage devices 1420 are computer-readable storage media that may store instructions that implement at least portions of the described technology. In addition, the data structures and message structures may be stored or transmitted via a data transmission medium, such as a signal on a communications link. Various communications links may be used, such as the Internet, a local area network, a wide area network, or a point-to-point dial-up connection. Thus, computer-readable media can include computer-readable storage media (e.g., "non-transitory" media) and computer-readable transmission media.

The instructions stored in memory 1410 can be implemented as software and/or firmware to program the processor(s) 1405 to carry out actions described above. In some embodiments, such software or firmware may be initially provided to the computing system 1400 by downloading it from a remote system through the computing system 1400 (e.g., via network adapter 1430).

The technology introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

Variations

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

While the aspects of the disclosure are described with reference to various implementations and exploitations, it will be understood that these aspects are illustrative and that the scope of the claims is not limited to them. In general, techniques for periodically performing an ECGM election process among available storage nodes as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

What is claimed is:

1. A method comprising:
retrieving, by a first storage node in a set of storage nodes, first identifiers which correspond to a process executing on each storage node in the set of storage nodes, wherein the process is for managing data storage among the set of storage nodes;
selecting a first identifier of the first identifiers based, at least in part, on a first criterion;
based on determining that the first identifier matches an identifier corresponding to the process on a second storage node, electing the second storage node of the set of storage nodes to be an acting manager for the set of storage nodes; and
directing, by the first storage node, data storage management requests to the second storage node.

2. The method of claim 1 further comprising:
determining a storage node in the set of storage nodes corresponding to a second identifier to be an acting manager for the set of storage nodes based on detecting that the second storage node is no longer accessible.

3. The method of claim 1 further comprising:
identifying a first subset of the set of storage nodes which are operational and electing a storage node in the first subset to be an acting manager for a second set of storage nodes based on detecting that the second storage node is no longer accessible.

4. The method of claim 1 further comprising:
based on detecting that all storage nodes in the set of storage nodes are accessible, electing a single storage node of the set of storage nodes to be an acting manager for the set of storage nodes.

5. The method of claim 1, wherein selecting the first identifier based, at least in part, on the first criterion comprises:
selecting the first identifier to be a lowest value identifier of the first identifiers.

6. The method of claim 1, wherein the set of storage nodes comprises storage nodes of a plurality of storage nodes which comprise program code for the process.

7. The method of claim 1, wherein the data storage management requests include an item selected from the list consisting of a request to create an erasure coding group, mark an erasure coding group as full, and mark an erasure coding group as in need of repair.

8. The method of claim 1 further comprising:
based on detecting that a plurality of the set of storage nodes are no longer accessible, identifying a number of available storage nodes in the set of storage nodes; determining whether the number of available storage nodes is sufficient to satisfy an erasure coding profile.

9. The method of claim 1 further comprising: after a period of time has elapsed:
electing an available storage node in the set of storage nodes to be an acting manager based, at least in part, on second identifiers.

10. A non-transitory machine readable storage medium having stored thereon instructions for performing a method comprising machine executable code which when executed by at least one machine, causes the machine to:
elect a first storage node to act as a data storage manager for a first set of storage nodes and a second set of storage nodes, wherein the first set of storage nodes and the second set of storage nodes are communicatively coupled via a network and cooperate to facilitate data storage; and
in response to an event disrupting communication between the first set of storage nodes and the second set of storage nodes: elect a second storage node to act as a data storage manager for the first set of storage nodes and elect a third storage node to act as a data storage manager for the second set of storage nodes.

11. The non-transitory machinereadable storage medium of claim 10, wherein electing the first storage node is performed as a periodic election.

12. The non-transitory machinereadable storage medium of claim 10 further comprising code to, based on detecting that communication with the first storage node has been disrupted, enable each storage node in the first set of storage nodes and the second set of storage nodes to act as a data storage manager.

13. A computing device comprising:

a memory containing a non-transitory machine readable storage medium comprising machine executable code having stored thereon instructions for performing a method of managing data storage in a set of storage nodes; and a processor coupled to the memory, the processor configured to execute the machine executable code to cause the processor to:

retrieve first identifiers which correspond to a process executing on each storage node in the set of storage nodes, wherein the set of storage nodes comprises a first storage node;

select a first identifier of the first identifiers based, at least in part, on a first criterion; and based on a determination that the first identifier matches an identifier corresponding to the process on the first storage node, begin managing data storage among the set of storage nodes by the first storage node.

14. The computing device of claim 13 further comprising code to cause the first storage node to: detect that a second storage node in the set of storage nodes is no longer accessible.

15. The computing device of claim 13, wherein selecting the first identifier based, at least in part, on the first criterion includes selecting the first identifier based on the first storage node having a highest amount of computing power compared to other nodes in the set of storage nodes.

16. The computing device of claim 13, wherein selecting the first identifier based, at least in part, on the first criterion includes selecting the first storage node based on the first storage node having a highest amount of available storage compared to other nodes in the set of storage nodes.

17. The computing device of claim 13, wherein the first criterion includes the first identifier being a highest value identifier of the first identifiers.

18. The computing device of claim 13, wherein managing data storage includes an item selected from the list consisting of requesting to create an erasure coding group, marking an erasure coding group as full, and marking an erasure coding group as in need of repair.

19. The computing device of claim 13, wherein the first criterion includes the first identifier being a lowest value identifier of the first identifiers.

20. The computing device of claim 13 further comprising program code executable by the processor to cause the first storage node to:

after a period of time has elapsed, elect a second storage node in the set of storage nodes to be an acting manager based, at least in part, on second identifiers.

* * * * *